United States Patent
Dong et al.

(10) Patent No.: US 11,398,566 B2
(45) Date of Patent: Jul. 26, 2022

(54) ENHANCEMENT-MODE III-V HEMT BASED ON ALL-SOLID-STATE BATTERY

(71) Applicant: HANGZHOU DIANZI UNIVERSITY, Hangzhou (CN)

(72) Inventors: Zhihua Dong, Hangzhou (CN); Zhiqun Cheng, Hangzhou (CN); Shiqi Li, Hangzhou (CN); Guohua Liu, Hangzhou (CN); Hui Liu, Hangzhou (CN); Jian Li, Hangzhou (CN)

(73) Assignee: HANGZHOU DIANZI UNIVERSITY, Hangzhou (CN)

( * ) Notice: Subject to any disclaimer, the term of this patent is extended or adjusted under 35 U.S.C. 154(b) by 108 days.

(21) Appl. No.: 17/043,855

(22) PCT Filed: Apr. 15, 2019

(86) PCT No.: PCT/CN2019/082605
§ 371 (c)(1),
(2) Date: Sep. 30, 2020

(87) PCT Pub. No.: WO2019/210770
PCT Pub. Date: Nov. 7, 2019

(65) Prior Publication Data
US 2021/0126119 A1     Apr. 29, 2021

(30) Foreign Application Priority Data
Apr. 29, 2018 (CN) .......................... 201810405244.6

(51) Int. Cl.
*H01L 29/778* (2006.01)
*H01L 23/58* (2006.01)
*H01L 27/06* (2006.01)

(52) U.S. Cl.
CPC .......... *H01L 29/7786* (2013.01); *H01L 23/58* (2013.01); *H01L 27/0629* (2013.01)

(58) Field of Classification Search
CPC ......... H01L 29/66431; H01L 29/66462; H01L 29/778–7789; H01L 2924/13064;
(Continued)

(56) References Cited
U.S. PATENT DOCUMENTS

2006/0113971 A1* 6/2006 Watanabe ........... H01L 29/7787
257/E29.253
2015/0124547 A1* 5/2015 Takemura ............. G11C 11/403
365/226
(Continued)

Primary Examiner — Scott B Geyer
(74) Attorney, Agent, or Firm — WPAT, PC

(57) ABSTRACT

An enhancement-mode III-V HEMT based on an all-solid-state battery is provided. In which, a second semiconductor layer and a first semiconductor layer are sequentially formed on a substrate, and a heterostructure is formed between the second semiconductor layer and the first semiconductor layer; a source electrode is electrically connected to a drain electrode through a 2DEG generated in the heterostructure; a gate electrode is used to control on-off of the 2DEG in the heterostructure; and an all-solid-state battery is arranged between the source electrode and the gate electrode, is composed of at least one group of battery units connected in series or connected in series and parallel, and is used to deplete the 2DEG in a corresponding region of the heterostructure.

10 Claims, 2 Drawing Sheets

(58) Field of Classification Search
CPC ... H01L 29/122–127; H01L 29/15–158; H01L 23/58; H01L 27/0629; H01M 6/18–20; H01M 14/00–005; H01M 2220/00; H01M 2300/0065–0082; H01M 4/13–1399
See application file for complete search history.

(56) References Cited

U.S. PATENT DOCUMENTS

| | | | |
|---|---|---|---|
| 2019/0189611 A1* | 6/2019 | Then | H01L 21/0262 |
| 2020/0185930 A1* | 6/2020 | Kuwata | H02J 7/345 |
| 2020/0395479 A1* | 12/2020 | Fujioka | H01L 29/7788 |
| 2020/0411677 A1* | 12/2020 | Then | H01L 29/7786 |

* cited by examiner

ENHANCEMENT-MODE III-V HEMT BASED ON ALL-SOLID-STATE BATTERY

BACKGROUND OF THE INVENTION

1. Technical Field

The invention relates to the field of microelectronic devices, in particular to an enhancement-mode III-V HEMT (High Electron Mobility Transistor) based on a combination structure (all-solid-state battery combination structure) of an all-solid-state battery and a diode pair.

2. Description of Related Art

With the development of technologies, people have increasingly high requirements for the parameters such as cutoff frequency, power density, and switching loss of microelectronic devices. People are attracted by these parameters to pay attention to III-V HEMTs. For example, the most typical AlGaN/GaN-based devices with various excellent properties are importantly used in the fields of 5G communication, phased array radars, photovoltaic power generation, electrical vehicles, and so on. As typical III-V devices, natural GaN-based HEMTs generate high spontaneous polarization and piezoelectric polarization in AlGaN/GaN-based heterojunctions due to the symmetry of crystal structures as well as high-concentration 2DEG (2 dimensional electron gas) at interfaces of the heterojunctions under natural conditions, thus being depletion-mode devices (also known as normally-on devices). There are no natural enhancement-mode devices (also known as normally-off devices). However, the enhancement-mode devices are essential in practical applications. How to obtain the enhancement-mode devices is a challenge. The prior art includes: (1) a trench gate technology for etching AlGaN below gates to deplete 2DEG in channels below the gates; (2) a technology for injecting pn junctions below gates, which is also known as a GIT (gate injection Transistor), regenerates P-type AlGaN layers below the gates, and heightens the bottoms of conduction bands on one sides of barriers by means of the p-n junctions to make triangular potential wells at the interfaces of the heterojunctions higher than the Fermi level, resulting in depletion of the 2DEG; and (3) an F ion implantation technology for implanting negatively charged F ions into barrier layers below gates by virtue of the small sizes of the F ions, resulting in depletion of the 2DEG.

The first technology cannot obtain accurate etching depths and are likely to damage the channels. The second technology greatly increases the cost of material growth due to the P-type materials. The third technology is difficult to control accurately and has potential reliability problems.

Accordingly, it is necessary to provide a technical solution to overcome the defects of the prior art.

SUMMARY OF THE INVENTION

In view of this, it is necessary to provide an enhancement-mode III-V HEMT based on an all-solid-state battery, which is obtained by introducing an all-solid-state battery technology into the field of microelectronic devices to generate a negative potential between a gate electrode and a source electrode to deplete electrons in channels close to the gate electrode.

The technical solution adopted by the present invention to fulfill the above-mentioned objective is as follows:

An enhancement-mode III-V HEMT based on an all-solid-state battery is characterized in that a second semiconductor layer (2) and a first semiconductor layer (3) are sequentially formed on a substrate (1), and a heterostructure is formed between the second semiconductor layer (2) and the first semiconductor layer (3); a source electrode (5) is electrically connected to a drain electrode (6) through a 2DEG generated in the heterostructure; a gate electrode (12) is used to control on-off of the 2DEG in the heterostructure; and an all-solid-state battery is arranged between the source electrode (5) and the gate electrode (12), is composed of at least one group of battery units connected in series or connected in series and parallel, and is used to deplete the 2DEG in a corresponding region of the hetero structure.

Preferably, the enhancement-mode III-V HEMT based on an all-solid-state battery further comprises a diode pair (13, 14), wherein the all-solid-state battery has a positive current collector (7) electrically connected to the source electrode (5) and a negative current collector (11) electrically connected to the gate electrode (12) through the diode pair (13, 14).

Preferably, a negative potential is generated between the gate electrode (12) and source electrode (5) of the all-solid-state battery to deplete electrons in channels close to the gate electrode (12).

Preferably, the all-solid-state battery is composed of at least one group of battery units connected in series or connected in series and parallel, wherein the battery units form a multi-layer film structure at least including the positive current collector (7), a positive film material layer (8), an all-solid-state electrolyte (9), a negative film material layer (10), and the negative current collector (11).

Preferably, an insulating layer (4) is arranged between the positive current collector (7) of the all-solid-state battery and the heterostructure.

Preferably, the insulating layer (4) is a single-layer insulator formed by $SiO_2$, AlON, $Si_3N_4$, or SiON, an HBN insulating two-dimensional material, or a multi-layer structure formed by these materials.

Preferably, the positive current collector (7) of the all-solid-state battery is formed by metal or an alloy, the positive film material layer (8) is formed by lithium oxide, metal sulfide, or a vanadium compound, the all-solid-state electrolyte (9) is any one of an inorganic solid-state electrolyte, an inorganic-organic solid-state electrolyte and a solid polymer electrolyte, and the negative film material layer (10) is formed by a nitride, an oxide, Li, or a composite material.

Preferably, the first semiconductor layer (3) is of a layered structure formed by any one of GaN, AlN, $Al_xGa_{1-x}N$, $In_xAl_{1-x}N$, $In_xAl_yGa_{1-x-y}N$, $In_xAl_{1-x}As$, $In_xGa_{1-x}As$, $Al_xGa_{1-x}As$ and $In_xAl_{1-x}Sb$, or is of a stacked structure formed by a combination of more than two of the GaN, the AlN, the $Al_xGa_{1-x}N$, the $In_xAl_{1-x}N$, the $In_xAl_yGa_{1-x-y}N$, the $In_xAl_{1-x}As$, the $In_xGa_{1-x}As$, the $Al_xGa_{1-x}As$ and the $In_xAl_{1-x}Sb$, wherein x is greater than or equal to 0 and is less than 1, y is greater than or equal to 0 and is less than 1, and x+y=1.

Preferably, the second semiconductor layer (2) is of a layered structure formed by any one of GaN, AlN, $Al_xGa_{1-x}N$, $In_xAl_{1-x}N$, $In_xAl_yGa_{1-x-y}N$, $In_xAl_{1-x}As$, $In_xGa_{1-x}As$, $Al_xGa_{1-x}As$ and InP, or is of a stacked structure formed by more than two or a combination of more than two of the GaN, the AlN, the $Al_xGa_{1-x}N$, the $In_xAl_{1-x}N$, the $In_xAl_yGa_{1-x-y}N$, the $In_xAl_{1-x}As$, the $In_xGa_{1-x}As$, the $Al_xGa_{1-x}As$ and the InP, wherein x is greater than or equal to 0 and is less than 1, y is greater than or equal to 0 and is less than 1, and x+y=1.

Preferably, the positive current collector (7) of the all-solid-state battery is electrically connected to the source electrode (5) by means of wire bonding, and the negative current collector (11) of the all-solid-state battery, the diode pair (13, 14), and the gate electrode (12) are electrically connected by means of wire bonding.

Compared with the prior art, the present invention at least has the following advantages: an enhanced operating mode is effectively achieved; regions below and outside a gate of the HEMT do not need to be etched, so that the problems of uniformity, repeatability, and damage which are caused by an etching process are solved, and high mobility of the electrons in the channels below the gate is guaranteed, thus guaranteeing high performance of the HEMT. Furthermore, the all-solid-state battery is compatible with a micro-nano machining process and can be obtained at a time in the process of the HEMT. Meanwhile, the threshold voltage of the HEMT may be changed by the number of units cascaded to form the all-solid-state battery.

Reference signs: 1, substrate and buffer material layer; 2, second semiconductor layer; 3, first semiconductor layer; 4, insulating layer; 5, source electrode of HEMT; 6, drain electrode; 7, positive current collector of all-solid-state battery; 8, positive electrode; 9, solid-state electrolyte; 10, negative electrode; 11, negative current collector; 12, gate electrode; 13 and 14, two positive electrodes of diode pair.

Figure 1:
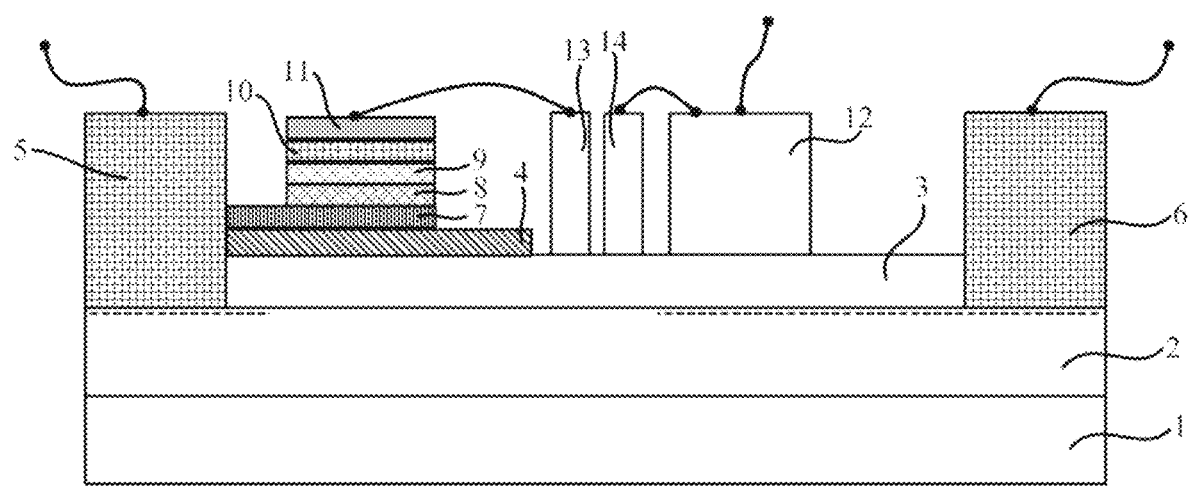
FIG. 1 is a sectional view of an enhancement-mode III-V HEMT based on an all-solid-state battery of the present invention.
Figure 2:
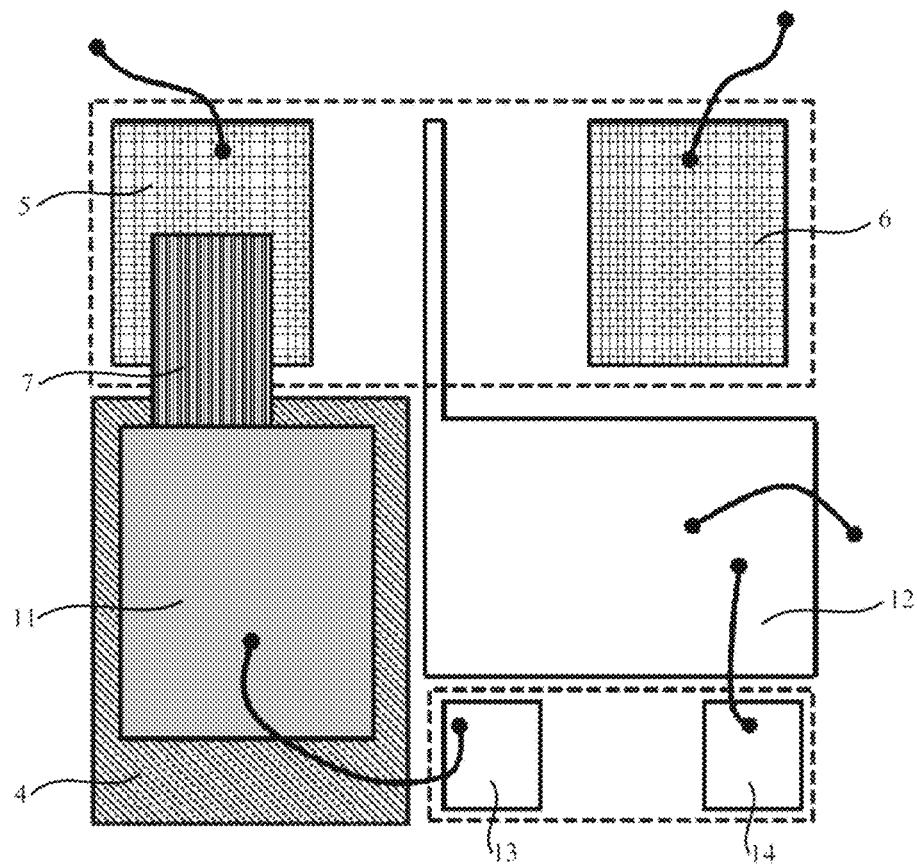
FIG. 2 is a top view of an enhancement-mode III-V HEMT based on an all-solid-state battery combination structure, wherein, in addition to visible reference signs in one-to-one correspondence with those in the sectional view, rectangular dashed boxes represent active regions of the HEMT.

It should be noted that FIG. 1 and FIG. 2 are schematic views, and the sectional view and the top view do not strictly conform to engineering drawing specifications in terms of size ratio and spatial correspondence. Although the diode pair in FIG. 1 is located between the gate electrode and the source electrode, in practice, the diode pair and a basic HEMT are not located in the same active region to be prevented against mutual interference. However, people with knowledge in the art can easily understand the content of the drawings.

DETAILED DESCRIPTION OF THE INVENTION

To overcome the technical defects of the prior art, the present invention introduces an all-solid-state battery technology into the field of microelectronic devices to provide a novel enhancement-mode HEMT and a method for obtaining the enhancement-mode HEMT.

Figure 3:
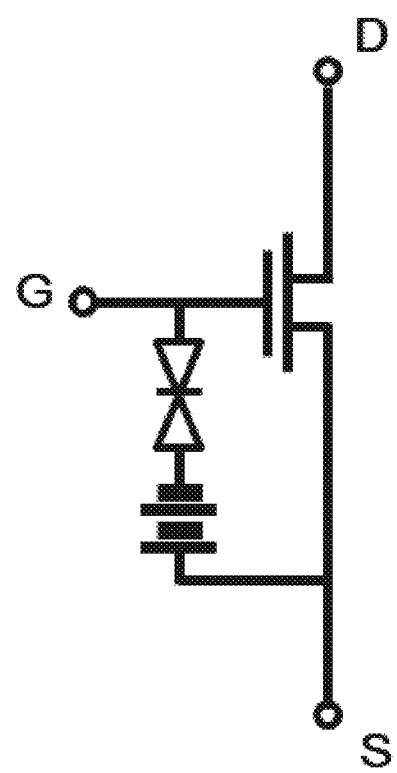
FIG. 3 is a schematic view of the HEMT of the present invention.

Referring to FIG. 1-FIG. 3, an enhancement-mode III-V HEMT based on an all-solid-state battery of the present invention comprises a source electrode 5, a drain electrode 6, a gate electrode 12, a heterostructure (formed between a first semiconductor layer 3 and a second semiconductor layer 2), an all-solid-state battery, and a diode pair (13, 14), wherein the source electrode is electrically connected to the drain electrode through a 2DEG generated in the heterostructure; the heterostructure is in ohmic contact with the source electrode and the drain electrode, and includes the first semiconductor layer 3 and the second semiconductor layer 2 which are sequentially arranged in a set direction, wherein the first semiconductor layer 3 is arranged between the source electrode and the drain electrode and has a surface provided with the gate electrode 12. An all-solid-state battery combination structure is located on an insulating layer 4 and includes an all-solid-state battery pack and the diode pair, and the insulating layer is located on a surface of a basic HEMT outside active regions (that is, the 2DEG only exists in this region and disappears outside this region through a microelectronic process). Furthermore, the all-solid-state battery pack is composed of at least one group of battery units connected in series or connected in series and parallel, wherein the battery units form a multi-layer film structure mainly including a positive current collector 7, a positive film material layer 8, an all-solid-state electrolyte 9, a negative film material layer 10, and a negative current collector 11; and the positive current collector 7 is electrically connected to a source electrode of a basic HEMT, and the negative current collector 11 of the all-solid-state battery pack is electrically connected to a gate electrode of the basic HEMT through the diode pair.

In a preferred embodiment, the diode pair is arranged between the source electrode 5 and the gate electrode 12; when an external voltage is applied to the HEMT, the gate electrode is accessed to a high potential, and the source electrode is accessed to a low potential; when a positive voltage high enough is applied to the gate electrode, the potential of the solid-state battery is offset, so that electrons in channels are regenerated, and the HEMT is conducive. However, a gate leakage current is extremely low due to a reverse connection of the diode pair. Wherein, the all-solid-state battery is composed of a positive electrode, a negative electrode, and an electrolyte containing no liquid, is compatible with a planar process for microelectronic devices, has high energy density, a small size, safety, and reliability, and is regarded as one of the most competitive batteries in the field of electrical vehicles. The all-solid-state battery is combined with the current HEMT by means of the microelectronic planar process and has an anode connected to the source electrode of the HEMT and a cathode connected with the gate electrode of the HEMT through the diode pair; when fully charged, the battery generates a negative potential between the gate electrode and the source electrode; and the area and series of the battery are reasonably designed to obtain a sufficient negative potential, in this way, the electrons in the channels close to the gate electrode can be depleted, so that the enhancement-mode HEMT is obtained. The diode pair is merely used to apply the negative potential of the battery between the gate electrode and the source electrode to make a current between the source electrode and the gate electrode be only used as a reverse conduction current across diodes.

The insulating layer has the following features: the insulating layer facilitates passivation of an inherent surface of the HEMT, that is, the surface state density of the HEMT outside the active regions will be lowered by the insulating layer; and the insulating layer has good electrical insulation performance, thus preventing the all-solid-state battery from affecting the electrical property of a core structure of the HEMT.

In a preferred embodiment, the enhancement-mode HEMT of the present invention is obtained by sequentially configuring the all-solid-state battery and the diode pair on a currently recognized conventional depletion-mode III-V HEMT. For example, an AlGaN/GaN-based HEMT comprises a source electrode 5 and a drain electrode 6 which are located at two ends of one surface of a first semiconductor layer 3 (namely an AlGaN layer here), wherein a gate electrode 12 is disposed on another surface of the first semiconductor layer 3 and located between the source electrode 5 and the drain electrode 6; and an insulating layer is located on the outermost surface of the AlGaN/GaN-based HEMT outside active regions and is sequentially provided with a positive current collector 7, a positive film material layer 8, a solid-state electrolyte 9, a negative film material layer 10, and a negative current collector 11. The diode pair has one positive electrode connected to the positive electrode of the all-solid-state battery and the other positive electrode connected to the gate electrode.

In order to overcome the defects of the prior art, the present invention further discloses a method for obtaining an enhancement-mode III-V HEMT by using an all-solid-state battery, which particularly comprises the following steps:

(a) A heterostructure mainly composed of a first semiconductor layer 3 and a second semiconductor layer 2 is formed on a selected substrate 1.

In a heterojunction material epitaxy embodiment, epitaxy technologies such as metal organic chemical vapor deposition (MOCVD), molecular beam epitaxy (MBE), or hydride vapor phase epitaxy (HVPE) may be performed in Step (a).

(b) An insulating layer 4 is formed on the first semiconductor layer 3.

In an insulating layer formation embodiment, a dielectric layer deposition technology such as atomic layer deposition (ALD), plasma-assisted atomic layer deposition (PEALD), sputtering, low-pressure chemical vapor deposition (LPCVD), pulsed laser deposition (PLD), or plasma enhanced chemical vapor deposition (PECVD) may be performed in Step (b).

(c) Ions are implanted outside active regions for insulation, and the insulating layer 4 is partially removed.

In an embodiment in which the insulating layer is partially removed, a dry etching or wet etching technology such as inductively coupled plasma etching, reactive ion etching, or ion beam etching may be performed in Step (c).

(d) A source electrode 5 and a drain electrode 6 are made on the first semiconductor layer 3.

In a source electrode and drain electrode metal deposition embodiment, metal deposition and rapid thermal annealing are sequentially performed to achieve ohmic contact in Step (d).

(e) A positive current collector 7, a positive film material layer 8, a solid-state electrolyte 9, a negative film material layer 10, and a negative current collector 11 are sequentially formed on the insulating layer 4 by means of deposition to form an all-solid-state battery.

In a preferred embodiment, in Step (e), a metal deposition technology such as electron beam evaporation or magnetron sputtering may be performed to form the positive current collector and the negative current collector; and chemical vapor deposition, physical vapor deposition, spin coating, screen printing, or the like may be performed to form the positive film material layer 8, the solid-state electrolyte, and the negative film material layer 10.

(f) A gate electrode and positive electrodes 13 and 14 of Schottky diodes are made in the active region on the first semiconductor layer.

In a preferred embodiment, the metal deposition technology such as the electron beam evaporation or the sputtering may be performed in Step (f).

(g) The all-solid-state battery is cascaded, and a basic HEMT, a battery pack, and the diodes are electrically connected.

Furthermore, wire bonding may be adopted as a method for achieving the above connection.

Embodiment 1

Referring to FIG. 1, an AlGaN/GaN-based HEMT is used as a basic HEMT. An insulating layer of the AlGaN/GaN-based HEMT is $Si_3N_4$, has a thickness of 100-200 nm and is formed through a LPCVD process.

An Ni layer of 150 nm is formed on the $Si_3N_4$ by means of sputtering through an electron beam evaporation process; then, an LiPON film of 500-2000 nm is formed on the Ni layer by means of RF magnetron sputtering with a lithium phosphate ceramic target as a sputtering source; then, an $LiCoO_2$ film of 250 nm is formed on the LiPON film by means of sputtering; then, Ti/Pt with a thickness of 10 nm/200 nm is formed on the $LiCoO_2$ film by means of evaporation; and finally, a gate electrode and a diode pair are made on an AlGaN surface. Ni/Au (50 nm/200 nm) is used as anode metal of diodes, the turn-on voltage of a single-stage diode is about 1-1.5V, and finally the basic HEMT, an all-solid-state battery, and the diode pair are electrically connected by means of wire bonding.

Furthermore, the all-solid-state battery is located in a square region and has a side length of 50-100 μm. After being charged, the battery has an operating voltage of about 2-5V and a capacity of about 10 $\mu Ahcm^{-2}$.

Embodiment 2

The AlGaN/GaN-based HEMT is used as the basic HEMT. The insulating layer of the AlGaN/GaN-based HEMT is $Si_3N_4$, has a thickness of 300 nm and is formed through the LPCVD process.

Ti of 250 nm is deposited on the $Si_3N_4$ with the thickness of 300 nm by means of the RF magnetron sputtering; then, a $LiMn_2O_4$ film of 800 nm is formed on the Ti by means of the RF magnetron sputtering with an $LiMn_2O_4$ target as a sputtering source; then, an LiPON film of 500 nm as a solid-state electrolyte is formed on the $LiMn_2O_4$ film with $Li_3PO_4$ as a sputtering source; then, a ZnO film of 450 nm is formed on the LiPON film; then, Ti of 250 nm is deposited on the ZnO film; and finally, the gate electrode and the diode pair are made on an AlN surface. Ni/Au (50 nm/200 nm) is used as the anode metal of the diodes, the turn-on voltage of the single-stage diode is about 1-1.5V, and finally the basic HEMT, the all-solid-state battery, and the diode pair are electrically connected by means of the wire bonding.

The whole all-solid-state battery is circular and has a radius of 80-120 μm. The output voltage of the battery is about 0.5-5V, and density of the output current of the battery is about 300-400 $mA/mm^2$.

Finally, it should be noted that the above embodiments are only used to explain the technical solutions of the present invention, and are not intended to limit the same. Those ordinarily skilled in the art should understand that they can still make modifications on the technical solutions described in these embodiments, or make equivalent substitutions on part of technical features therein. These modifications or substitutions do not make the essence of the corresponding technical solutions deviate from the spirit and scope of the device of the present invention.

What is claimed is:

1. An enhancement-mode III-V HEMT based on an all-solid-state battery, comprising: a second semiconductor layer and a first semiconductor layer are sequentially formed on a substrate, and a heterostructure is formed between the second semiconductor layer and the first semiconductor layer; a source electrode is electrically connected to a drain electrode through a 2DEG generated in the heterostructure; a gate electrode is used to control on-off of the 2DEG in the heterostructure; and an all-solid-state battery is arranged between the source electrode and the gate electrode, is composed of at least one group of battery units connected in series or connected in series and parallel, and is used to deplete the 2DEG in a corresponding region of the heterostructure.

2. The enhancement-mode III-V HEMT based on an all-solid-state battery according to claim 1, further comprising a diode pair having cathodes connected mutually, wherein the all-solid-state battery has a positive current collector electrically connected to the source electrode and a negative current collector electrically connected to the gate electrode through the diode pair.

3. The enhancement-mode III-V HEMT based on an all-solid-state battery according to claim 1, wherein a negative potential is generated between the gate electrode and source electrode of the all-solid-state battery to deplete electrons in channels close to the gate electrode.

4. The enhancement-mode III-V HEMT based on an all-solid-state battery according to claim 1, wherein the all-solid-state battery is composed of at least one group of battery units connected in series or connected in series and parallel, wherein the battery units form a multi-layer film structure at least including the positive current collector, a positive film material layer, an all-solid-state electrolyte, a negative film material layer, and the negative current collector.

5. The enhancement-mode III-V HEMT based on an all-solid-state battery according to claim 4, wherein the positive current collector of the all-solid-state battery is formed of metal or an alloy, the positive film material layer is formed of lithium oxide, metal sulfide, or a vanadium compound, the all-solid-state electrolyte is any one of an inorganic solid-state electrolyte, an inorganic-organic solid-state electrolyte and a solid polymer electrolyte, and the negative film material layer is formed of a nitride, an oxide, Li, or a composite material.

6. The enhancement-mode III-V HEMT based on an all-solid-state battery according to claim 1, wherein an insulating layer is arranged between the positive current collector of the all-solid-state battery and the heterostructure.

7. The enhancement-mode III-V HEMT based on an all-solid-state battery according to claim 6, wherein the insulating layer is a single-layer insulator formed of $SiO_2$, AlON, $Si_3N_4$, or SiON, an HBN insulating two-dimensional material, or a multi-layer structure formed of these materials.

8. The enhancement-mode III-V HEMT based on an all-solid-state battery according to claim 1, wherein the first semiconductor layer is of a layered structure formed of any one of GaN, AlN, $Al_xGa_{1-x}N$, $In_xAl_{1-x}N$, $In_xAl_yGa_{1-x-y}N$, $In_xAl_{1-x}As$, $In_xGa_{1-x}As$, $Al_xGa_{1-x}As$ and $In_xAl_{1-x}Sb$, or is of a stacked structure formed of a combination of more than two of the GaN, the AlN, the $Al_xGa_{1-x}N$, the $In_xAl_{1-x}N$, the $In_xAl_yGa_{1-x-y}N$, the $In_xAl_{1-x}As$, the $In_xGa_{1-x}As$, the $Al_xGa_{1-x}As$ and the $In_xAl_{1-x}Sb$, wherein x is greater than or equal to 0 and is less than 1, y is greater than or equal to 0 and is less than 1, and x+y=1.

9. The enhancement-mode III-V HEMT based on an all-solid-state battery according to claim 1, wherein the second semiconductor layer is of a layered structure formed of any one of GaN, AlN, $Al_xGa_{1-x}N$, $In_xAl_{1-x}N$, $In_xAl_yGa_{1-x-y}N$, $In_xAl_{1-x}As$, $In_xGa_{1-x}As$, $Al_xGa_{1-x}As$ and InP, or is of a stacked structure formed of more than two or a combination of more than two of the GaN, the AlN, the $Al_xGa_{1-x}N$, the $In_xAl_{1-x}N$, the $In_xAl_yGa_{1-x-y}N$, the $In_xAl_{1-x}As$, the $In_xGa_{1-x}As$, the $Al_xGa_{1-x}As$ and the InP, wherein x is greater than or equal to 0 and is less than 1, y is greater than or equal to 0 and is less than 1, and x+y=1.

10. The enhancement-mode III-V HEMT based on an all-solid-state battery according to claim 1, wherein the positive current collector of the all-solid-state battery is electrically connected to the source electrode by means of wire bonding, and the negative current collector of the all-solid-state battery, the diode pair, and the gate electrode are electrically connected by means of wire bonding.

* * * * *